United States Patent
Pavlinak et al.

(10) Patent No.: US 10,138,554 B2
(45) Date of Patent: Nov. 27, 2018

(54) METHOD OF PLASMA TREATMENT OF AN INTERNAL AND/OR EXTERNAL SURFACE OF A HOLLOW ELECTRICALLY NON-CONDUCTIVE BODY AND A DEVICE FOR CARRYING OUT THIS METHOD

(71) Applicant: Masarykova univerzita, Brno (CZ)

(72) Inventors: David Pavlinak, Hodonin (CZ); Dusan Kovacik, Liskova (SK); Mirko Cernak, Bratislava (SK)

(73) Assignee: MASARYKOVA UNIVERZITA, Brno (CZ)

(*) Notice: Subject to any disclaimer, the term of this patent is extended or adjusted under 35 U.S.C. 154(b) by 216 days.

(21) Appl. No.: 15/106,005

(22) PCT Filed: Dec. 18, 2014

(86) PCT No.: PCT/CZ2014/000159
§ 371 (c)(1),
(2) Date: Jun. 17, 2016

(87) PCT Pub. No.: WO2015/090258
PCT Pub. Date: Jun. 25, 2015

(65) Prior Publication Data
US 2016/0319433 A1 Nov. 3, 2016

(30) Foreign Application Priority Data
Dec. 19, 2013 (CZ) .................................. 2013-1045

(51) Int. Cl.
*H05H 1/24* (2006.01)
*C23C 16/513* (2006.01)

(52) U.S. Cl.
CPC ......... *C23C 16/513* (2013.01); *H05H 1/2406* (2013.01); *H05H 2001/245* (2013.01);
(Continued)

(58) Field of Classification Search
CPC ..... H05H 2001/2418; H05H 2001/245; H05H 2001/2412; H05H 2001/2431; H05H 1/2406
See application file for complete search history.

(56) References Cited

U.S. PATENT DOCUMENTS 5,521,351 A 5/1996 Mahoney
7,967,945 B2 6/2011 Glukhoy et al.
(Continued)

FOREIGN PATENT DOCUMENTS

CN 103025040 A 4/2013
JP 2008-246099 A 10/2008
(Continued)

OTHER PUBLICATIONS

International Search Report, dated Mar. 30, 2015 (3 pages).
(Continued)

*Primary Examiner* — Joel G Horning
(74) *Attorney, Agent, or Firm* — Jacobson Holman, PLLC.

(57) ABSTRACT

A method of plasma treatment of an internal and/or external surface of a hollow electrically non-conductive body. The internal surface of the body and/or its external surface acts a layer of electrical plasma of a surface dielectric barrier discharge generated in a volume of gas by alternating or pulse voltage with an amplitude higher than 100 V from a pair of liquid electrodes formed by an internal electrically conductive liquid situated inside the body and by an external electrically conductive liquid situated outside the body. The electrical plasma is generated above the surface of the electrically conductive liquid, where in the volume of the gas forms a layer of electrical plasma forming a ring copying the shape of the surface of the body wherein the electrical resistance between the liquid electrodes is greater than 10 kΩ. The invention also is a device for carrying out the aforementioned method.

10 Claims, 3 Drawing Sheets

(52) U.S. Cl.
CPC .......... *H05H 2001/2412* (2013.01); *H05H 2001/2418* (2013.01); *H05H 2001/2431* (2013.01)

(56) References Cited

U.S. PATENT DOCUMENTS

| | | |
|---|---|---|
| 2003/0098085 A1 | 5/2003 | Ito et al. |
| 2008/0248217 A1 | 10/2008 | Takimoto |
| 2010/0034985 A1 | 2/2010 | Krueger et al. |
| 2012/0129582 A1 | 5/2012 | Hongo et al. |
| 2013/0118406 A1 | 5/2013 | Rostaing |
| 2013/0129582 A1 | 5/2013 | Eichler et al. |
| 2013/0189156 A1 | 7/2013 | Keener et al. |

FOREIGN PATENT DOCUMENTS

| | | |
|---|---|---|
| JP | 2010-51941 A | 3/2010 |
| WO | 2004/068916 A1 | 8/2004 |
| WO | 2008/082297 A1 | 7/2008 |
| WO | 2012/097987 | 7/2012 |

OTHER PUBLICATIONS

Andre et al., "Experimental study of discharge with liquid non-metallic (tap-water) electrodes in air at atmospheric pressure", J. Phys. D: Appl. Phys., vol. 34, pp. 3456-3465, Dec. 5, 2001.

Wen et al., "Improvement in the hydrophilic property of inner surface of polyvinyl chloride tube by DC glow discharge plasma", VACUUM vol. 85, pp. 406-410, Aug. 2, 2010.

Fang et al., "Comparison of surface modification of polypropylene film by filamentary DBD at atmospheric pressure and homogenous DBD at medium pressure in air", J. Phys. D: Appl. Phys., vol. 42, pp. 1-9, Mar. 26, 2009.

Gibalov et al., "The development of dielectric barrier discharges in gas gaps and on surfaces", J. Phys. D: Appl. Phys., vol. 333, pp. 2618-2636, Aug. 11, 2000.

Khorasani et al., "Effect of oxygen plasma treatment on surface charge and wettability of PVC blood bag—In vitro assay", ScienceDirect Radiation Physics and Chemistry, vol. 76, pp. 1011-1016, Oct. 5, 2006.

Massines et al., "A comparison of polypropylene-surface treatment by filamentary, homogenous and glow discharges in helium at atmospheric pressure", J. Phys. D: Appl. Phys., vol. 31, pp. 3411-3420, Sep. 24, 1998.

Polak et al., "Innovative Plasma Generation in flexible Biopsy Channels for Inner-Tube Decontamination and Medical Applications", Plasma Process. Polym., vol. 9, pp. 67-76, 2012.

Sato et al., "Generation and Transportation Mechanisms of Chemically Active Species by Dielectric Barrier Discharge in a Tube for Catheter Sterilization", Plasma Process. Polym., vol. 5, pp. 606-614, 2008.

Schwabedissen et al., "PlasmaLabel—a New Method to Disinfect Goods Inside a Closed Package Using Dielectric Barrier Discharges", Contrib. Plasma Phys., vol. 47, No. 7, pp. 551-558, Nov. 5, 2007.

Williamson et al., "Comparison of high-voltage ac and pulsed operation of a surface dielectric barrier discharge", J. Phys. D: Appl. Phys., vol. 39, pp. 4400-4406, Sep. 29, 2006.

METHOD OF PLASMA TREATMENT OF AN INTERNAL AND/OR EXTERNAL SURFACE OF A HOLLOW ELECTRICALLY NON-CONDUCTIVE BODY AND A DEVICE FOR CARRYING OUT THIS METHOD

FIELD OF THE INVENTION

This invention relates to plasma treatment of an internal and/or external surface of a hollow electrically non-conductive body and a device for carrying out this method using a non-equilibrium electrical plasma, preferably generated at atmospheric pressure, to modify the properties of the external and internal surfaces of dielectric hollow bodies.

BACKGROUND OF THE INVENTION

In technical practice, it is often necessary to modify the properties of the external and internal surfaces of hollow bodies made of dielectric materials such as polymeric materials, glass, and ceramics in order to obtain the desired surface properties for their end use.

Such modified hollow electrically non-conductive bodies include for example hoses, tubes, bottles, containers, test tubes and cuvettes, hollow fibers and capillaries, catheters and similar hollow instruments and aids used in medicine such as blood bags and similar containers for medical application.

Commercially desirable properties which can be obtained through surface treatment include, for example, hydrophilicity or hydrophobicity, biocompatibility, antimicrobial properties, electrical conductivity, surface permeability for gases and liquids, sorption properties, adhesion, and the like.

For these mentioned surface treatments, so-called "wet methods" are typically currently used. Through the use of liquid solvents and aggressive acidic and alkaline solutions, it is possible to achieve, for example, the cleaning and etching of surfaces, biological decontamination, surface activation, the creation of chemical groups, covering a surface with thin layers of other materials, and surface immobilization of nanoparticles.

According to Advanced Surface Coatings: A Handbook of Surface Engineering, D. S. Rickerby and A. Matthews Blackie & Son Limited, Glasgow and London, England 1991, the application of wet methods of surface treatments are normally associated with environmental problems resulting from the use of toxic and corrosive chemicals.

According to Surface Preparation Techniques for Adhesive Bonding, Raymond F. Wegman, James Van Twisk, Elsevier 2013, an ecologically and often cost-effective alternative to wet surface treatments is the use of non-equilibrium electrical plasma.

An electrical plasma is a sufficiently ionized gas with an approximately equal concentration of positive and negative electrical charge carriers. In technical practice, it is mainly generated through the use of electrical discharges in gases. Electrical discharges are generated in an electrical field sufficient to accelerate electrons to energies of the order of several eV to tens of eV and a corresponding temperature of $10^4$ to $10^5$ K. These values are then sufficient to ionize a gas by collisions of its molecules with electrons. For surface treatment, thermally a nonequilibrium plasma, otherwise also known as non-isothermal plasma, is preferably used, where the electron temperature reaches $10^4$ to $10^5$ K while the temperature of the gas molecules and other electrically neutral particles in the plasma is approximately equal to the ambient temperature.

Diffusion non-equilibrium plasma suitable for surface treatment of materials is simply generated at gas pressures of the order of a thousand times lower than atmospheric pressure. Applications of low-temperature plasma for surface treatment of the external surfaces of hollow bodies are described in documents US20030098085 and JP20080246099. The treatments of the internal surfaces of hollow bodies with a low pressure plasma are described in documents US 2008/0248217, US20100034985, US2013129582, US2013118406 and US2012129582, U.S. Pat. No. 5,521,351 and U.S. Pat. No. 7,967,945 in the international patent application WO/20121097987, and in the article from Xiao Qiong Wen et al.: Vacuum 85(2010) 406-410 and from M. T. Khorasani and H. Mirzadeh: Radiation Physics and Chemistry 76, (2007) 1011-1016.

In J. R. Roth, Industrial Plasma Engineering, Vol. 2: Applications to Nonthermal Plasma Processing, (Inst. of Phys. Publishing, Bristol and Philadelphia, 2001), it is stated that due to the economic and technical demands of pumping and vacuum equipment, the current trend in industrial applications of plasma for surface treatments is the use of techniques allowing for the generation of plasma at atmospheric pressure or at pressures close to atmospheric. As a result of the formation of instability in electrical plasma generated at pressures from approximately 10% of atmospheric pressure, leading to filamentarization, the generation of non-equilibrium diffuse plasma under atmospheric pressure is a known technical problem. In the case of the application of plasma at pressures close to atmospheric pressure for machining internal surfaces of hollow bodies, and especially of long hollow bodies, this technical problem is even more complicated. Another disadvantage is that it usually requires the imposition of metal electrodes or the entire source of plasma to the interior part of these bodies.

According to the results listed in F. Massines et al., J. Phys. D: Appl Phys. 31 (1998) 3411-3420 and in the work of Z. Fang et al., J. Phys. D: Appl. Phys. 42 (2009) 085204 it is known that the diffuse nature of plasma is important for achieving a uniform treatment of the surface, further for increasing the efficiency of the treatment, and for stability of the results obtained.

The article by T. Sato et al., Plasma Process. Polym. 2008, 5, 606-614 describes a method of sterilization of the internal surface of polymeric tubes and catheters using plasma generated at atmospheric pressure. The essence of the method of sterilization involves inserting an internal electrode with a small radius of curvature and the application of a sufficiently high voltage between this electrode and an auxiliary electrode situated on the outside of the tube. This creates an electrical field on the surface of the electrode sufficient to ionize the gas and generate the plasma. The disadvantage of this solution is the technically complicated insertion of the electrode into the interior of the hollow tube and inhomogeneity of the plasma generated in this manner. Another disadvantage of this solution is that it does not allow for the treatment of the external surface of the tube.

The article by M. Polák et al. Plasm. proc. Polym. 2012, 9, 67-76 and the international patent application PCT/EP2011/0510 both describe a method for generating plasma under atmospheric pressure inside a long tube using a pair of electrodes spirally deposited on the surface of the tube. The disadvantages of this solution are the technically complicated construction of the electrodes themselves and their complicated electrical insulation. Another technical disadvantage of this solution is that it is necessary to reduce the electrical voltage needed to ignite the electrical discharge without the danger of disturbing the electrical insulation between the electrodes. This is achieved using expensive inert gases such as argon (Ar) and helium (He). Another disadvantage of this solution is that it does not allow for the treatment of the external surface of the tube.

The document US20130189156 describes a solution using a dielectric barrier discharge to sterilize the internal surface of hollow containers using two enclosed external electrodes. The disadvantage of this solution, as in the similar solution described in A. Schwabedissen et al, Contrib. Plasma Phys. 47 (2007) 551-558 using a surface barrier discharge, is the very inhomogeneous treatment of the internal surface of the hollow body.

Basic properties, electrode geometry, and method of powering the surface dielectric barrier discharge generated using metal electrodes are described in the document WO2008082297 and in the publications of V. I. Gibalov and G. J. Pietsch J. Phys. D: Appl. Phys. 33 (2000) 2618-2636 and James M. Williamson at al.: J. Phys. D.: Appl. Phys. 39 (2006) 4400. The disadvantages of this solution can be the impossibility of the treatment of the internal surface of the hollow bodies and the use of metal electrodes, the corrosion, erosion, or sputtering of which can lead to their inoperativeness and contamination of the surface.

In James M. Williamson at al.: J. Phys. D: Appl. Phys. 39 (2006) 4400 a surface dielectric barrier discharge was studied, generated using AC voltage pulse and pulse voltage with the rapid increase of the voltage pulse. It was observed that when using AC voltage, the surface dielectric barrier discharge has a filamentary structure. It was found that the creation of a diffusion plasma is possible only with the use of a rapidly rising voltage pulse, which is technically very demanding.

The objective of the invention is to create a method of plasma treatment of the internal and/or external surface of a hollow electrically non-conductive body which would eliminate the aforementioned drawbacks, in particular which would reduce or limit the possibility of damaging the electrodes, and which would ensure the uniform and easy treatment of hollow electrically non-conductive bodies on their internal and external surfaces. Another objective of the invention is to create a device for implementing this method.

SUMMARY OF THE INVENTION

This objective is solved by the creation of a method for plasma treatment of the internal and/or external surface of a hollow electrically non-conductive body according to the present invention. The essence of the invention consists in that the internal surface of a hollow electrically non-conductive body and/or on the external surface of a hollow electrically non-conductive body is treated with a layer of electrical plasma of a surface dielectric barrier discharge generated in a volume of gas using alternating or pulse voltage with an amplitude higher than 100 V from a pair of liquid internal electrodes consisting of an internal electrically conductive liquid situated inside a hollow electrically non-conductive body and an external electrically conductive liquid situated outside a hollow electrically conductive body. The advantage of using an electrically conductive liquid consists in that no corrosion and erosion of such electrodes occurs. The electrical plasma is generated above the surface of the electrically conductive fluid, wherein in the volume of the gas there forms a layer of electrical plasma forming a ring copying the shape of the surface of the hollow electrically non-conductive body. The electrical resistance between the liquid electrodes is greater than 10 kΩ. The electrical plasma is produced above the surface of the liquid electrode and on the surface of the hollow electrically non-conductive body whose internal or external circumference it copies. The ring of the electrical plasma forms in the volume of gas above the liquid electrode. If the vessel or hollow body is completely filled with the liquid electrode, the ring of electrical plasma cannot form above the surface of this liquid electrode. Conversely, if the level of internal and external electrically conductive liquid forming the liquid electrode is approximately at the same height and does not fill the entire volume of the reagent vessel and the hollow body, the ring of electrical plasma forms along the internal and external circumference of the hollow electrically non-conductive body.

In one embodiment of the method according to the invention, the hollow electrically non-conductive body is first placed in a reagent vessel, then in a further step the reagent vessel is filled outside around the hollow body with the electrically conductive liquid, which is electrically grounded. Then, the internal volume of the hollow electrically non-conductive body is gradually filled inside with the electrically conductive fluid, into which is fed an alternating voltage, by which a ring of electrical plasma is generated above the surface of the internal electrically conductive liquid. The level of the internal electrically conductive liquid gradually rises, thereby treating the internal surface of the hollow electrically non-conductive body along its entire length.

In another preferred embodiment, the internal volume of the hollow electrically non-conductive body is filled internally with the electrically conductive liquid, which is electrically grounded. Then, the reagent vessel around the hollow electrically non-conductive body is gradually filled outside with the electrically conductive liquid, into which is fed an alternating voltage, by which a ring of electrical plasma is generated above the surface of external electrically conductive liquid, and the level of the external electrically conductive liquid gradually rises.

In another preferred embodiment, the hollow electrically non-conductive body is deposited into a reagent vessel, then the reagent vessel is gradually filled outside with the electrically conductive liquid and simultaneously the hollow electrically non-conductive body is gradually filled inside with the electrically conductive liquid. Alternating voltage is fed to one electrode liquid and the second liquid electrode is grounded. The ring of electrical plasma is generated simultaneously above the internal electrically conductive liquid and above the external electrically conductive liquid.

The electrical plasma is generated under a gas pressure higher than 10 kPa and less than 200 kPa. The discharge can advantageously take place at the atmospheric pressure of the gas. The gas may be air or nitrogen or argon.

The frequency of the time of the varying electrical voltage supplied between the internal and external electrically conductive liquid is between 50 Hz and 20 MHz.

The amplitude of the voltage supplied between the internal electrically conductive liquid and the external electrically conductive liquid is between 100 V and 200 kV.

It is preferred that the internal electrically conductive liquid and/or external electrically conductive liquid contains at least 50% water by volume.

In a preferred embodiment, the internal electrically conductive liquid and/or external electrically conductive liquid contains at least 1% hydrocarbon compounds by volume. These are generally all chemicals that contain a hydrocarbon chain and whose presence in the liquid changes the process of treatment or the result of treatment by the plasma. For example, grafting occurs of new functional chemical groups which were previously part of the hydrocarbon compounds, or direct attachment to the surface of the hollow body occurs.

In another preferred embodiment, the internal electrically conductive liquid and/or external electrically conductive liquid contains dispersed nanoparticles. As components of electrically conductive liquids for use according to the invention, substances may advantageously be used whose vapor, through the effect of the plasma, creates highly reactive chemical radicals that can react with the surface of the hollow body. For example, for molecules of water and aqueous solutions, the effect of the plasma creates reactive OH radicals. Electrically conductive liquids for use according to the invention may additionally contain organic and inorganic molecules which, through the effect of the plasma, can dissociate and subsequently polymerize or be otherwise deposited on the plasma treated surface.

The invention also is a device for performing the method of plasma treatment of the internal and/or external surface of a hollow electrically non-conductive body. Its essence is that the device includes a reagent vessel for the vertical placement of the hollow electrically non-conductive body and two liquid electrodes, one of which is formed by the internal electrically conductive liquid filling the volume of the hollow electrically non-conductive body, and the second is formed by the external electrically conductive liquid filling the reagent vessel around the hollow electrically non-conductive body, and above the surface of the internal electrically conductive liquid is the internal gas while above the surface of the external electrically conductive liquid is the external gas, while the electrical resistance between the internal electrically conductive liquid and the external electrically conductive liquid is greater than 10 k$\Omega$, and the device is equipped with a source of alternating or pulse voltage having an amplitude of greater than 100 V to form a layer of diffusion electrical plasma forming a ring copying the shape of the hollow electrically non-conductive body above the surface of the internal electrically conductive liquid in the internal gas or above the surface of the external electrically conductive liquid in the external gas.

In a preferred embodiment, the invention includes a device for the gradual adjustment of the height of the surface of the internal electrically conductive liquid in the internal volume of the hollow electrically non-conductive body, and/or a device for the gradual adjustment of the height of the surface of the external electrically conductive liquid in the internal volume of the reagent vessel around the hollow electrically non-conductive body. The device may be formed by a pump or input for the liquid with a valve for the non-pressurized admission of liquid or gas.

The advantage of the invention is the exceptionally low ignition voltage and therefore the simple generation of the surface dielectric barrier discharge. This positive effect likely arises as a result of the strong and time varying electrical field on the line of "triple points" at the interface of the liquid, ambient gas, and the surface of the treated hollow body. Another advantage of the invention is that a thus generated discharge powered by alternating electrical voltage may be diffuse, which is very advantageous for the uniform and efficient surface treatment of hollow bodies.

DESCRIPTION OF THE DRAWINGS

The invention is further illustrated by means of the drawings, in which.

EXAMPLES OF THE PREFERRED EMBODIMENTS OF THE INVENTION

It should be understood that the hereinafter described and illustrated specific examples of the realization of the invention are presented for illustrative purposes and not as a limitation of the examples of the realization of the invention to the cases shown herein. Experts who are familiar with the state of technology shall find, or using routine experimentation will be able to determine, a greater or lesser number of equivalents to the specific realizations of the invention which are specifically described here. These equivalents shall also be included into the scope of the patent claims.

Example 1

Figure 1:
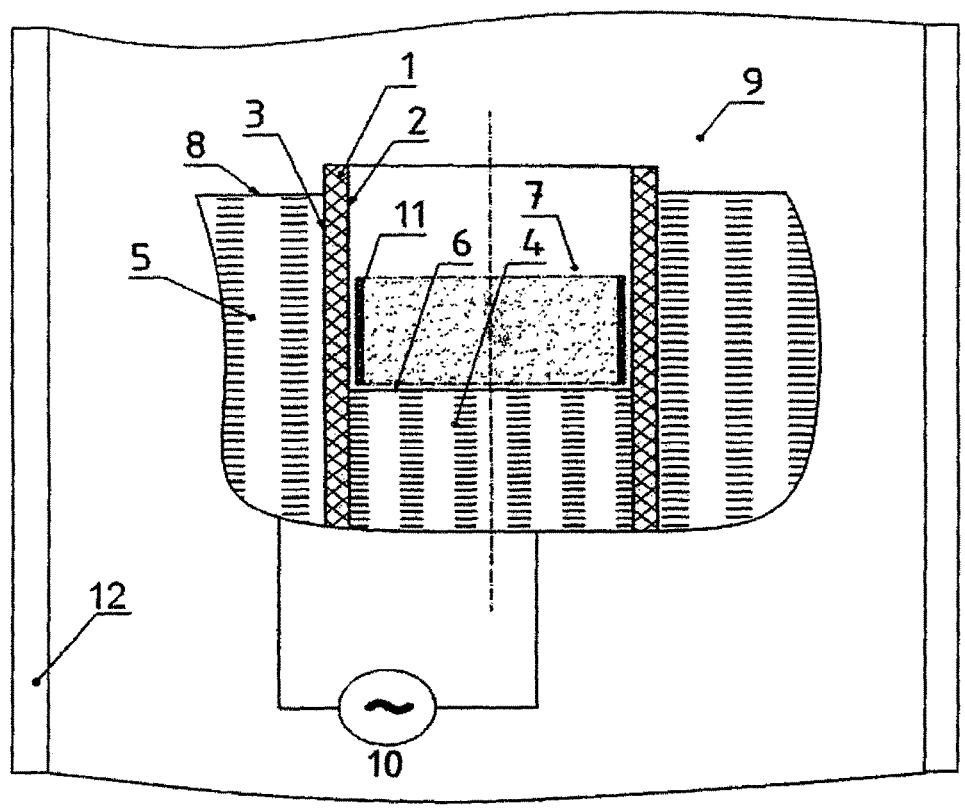
FIG. 1 shows a sectional view of the reagent vessel and the hollow electrically non-conductive body when the plasma treatment takes place on the internal surface of the electrically non-conductive hollow body.

The method and device according to the invention were applied to activate the internal surface 2 of a capillary, representing a hollow electrically non-conductive body 1, made of quartz glass with a length of 100 cm, a diameter of 3 mm and a wall thickness of 0.5 mm before applying a thin layer of titanium dioxide ($TiO_2$). The internal surface 2 of the capillary was treated by the method as illustrated in FIG. 1. The capillary was inserted into the reagent vessel 12 with a depth of 110 cm filled with an external electrically conductive liquid 5, which was normal drinking water with an electrical conductivity of 0.3 mS·cm$^{-1}$. The water in the reagent vessel 12 was electrically grounded. Into the interior of the capillary filled with air at a pressure of 0.1 MPa there was led a supply with internal electrically conductive liquid 4, which was distilled water with added sodium chloride (NaCl) at a concentration of 100 g per kilogram of solvent. The resulting solution of the internal electrically conductive liquid 4 had a conductivity of 130 mS·cm$^{-1}$. The interior of the capillary and the inlet for the internal electrically conductive liquid 4 was electrically isolated from the external vessel. To the solution of internal electrically conductive liquid 4 there was led an alternating voltage 10 amplitude (peak to peak) 22 kV and a frequency of 20 kHz. In this way, the surface 6 of the internal electrically conductive liquid 4 at electrical power of 50 W there was generated an electrical plasma which formed the ring 11 around the internal circumference of the capillary. The surface 6 of the internal electrically conductive liquid 4 was moving at a speed of 3 mm·s$^{-1}$ against the internal surface 2, while by the effect of the plasma, the internal surface 2 of the capillary was purified of sorbed hydrocarbon molecules while increasing the surface concentration of hydroxyl groups. After treatment by the plasma, the capillary was washed with distilled water. The $TiO_2$ precursor solution was prepared by stirring a mixture of titanium isopropoxide ($Ti\{OCH(CH_3)_2\}_4$) with a solution of ethanol and acetic acid. The plasma treated internal surface 2 of the capillary was flushed with the $TiO_2$ precursor solution, which created a thin layer on the wall of the capillary. Subsequently the capillary was annealed for 1 hour at 400° C., thereby forming on the surface a 75 nm thick compact TiO$_2$ layer with excellent adhesion to the glass surface. The quartz capillary covered with the layer of TiO2 was then successfully used in flow experiment of the photocatalytic decomposition of phenol in water.

Example 2

The method and device according to the invention were applied to activate the internal surfaces 2 of a 50 cm long bundle of a hundred hollow polypropylene fibers representing a hollow electrically non-conductive body 1 with an internal diameter of 0.5 mm and a wall thickness of 0.1 mm before being subsequently covered non-electrolytically with copper. The resulting product has a potential for use in heat exchangers. The fiber bundle was inserted into the reagent vessel 12 with a depth of 50 cm filled with an external electrically conductive liquid 5, which was normal drinking water with electrical conductivity of 0.3 mS·cm$^{-1}$. Into the internal part of the hollow fibers filled with air at a pressure of 0.1 MPa there was led an inlet of internal electrically conductive liquid 4, which was distilled water with added sodium chloride (NaCl) at a concentration of 100 g per kilogram of solvent and conductivity of 130 mS·cm$^{-1}$. The external electrically conductive liquid 5 in the reagent vessel 12 was electrically grounded and at the same time electrically insulated from the internal electrically conductive liquid 4, to which was led an alternating voltage 10 with amplitude (peak to peak) of 22 kV and frequency of 20 kHz. In this way, above the surface 6 of the aqueous solution of NaCl inside the hollow fibers at a power of 300 W, there was generated a diffuse electrical plasma forming a ring 11 around the internal circumference of the fibers. The surface 6 of the internal electrically conductive liquid 4 was moving inside the hollow fibers at a speed of 3 mm·s$^{-1}$ thereby ensuring efficient activation and hydrophilization of the internal surface 2 of the polypropylene hollow fibers throughout their entire length. After treatment by the plasma, the bundle of hollow fibers was thoroughly washed inside and outside with distilled water and the interior of the hollow fibers was then evenly plated with a layer of copper with good adhesion according to the following procedure.

Plating Process:
1) Rinse with a solution of hydrochloric acid (HCl) with added wetting agent
2) Rinse with a solution of palladium chloride (PdCl$_2$) at a concentration of 50-200 mg·l$^{-1}$, stannous chloride (SnCl$_2$) at a concentration of 5-20 gl$^{-1}$ and HCl at a concentration of 100-200 ml·l$^{-1}$ at a temperature of 25° C. for 2 minutes.
3) Accelerate the reaction in the HCl concentration of 80-100 ml·l$^{-1}$ at a temperature of 35° C. for 2 minutes.
4) Plate in an aqueous solution for 20 minutes at a temperature of 45° C. containing copper sulfate (CuSO$_4$) at a concentration of 8-10 gl$^{-1}$, ethylenediaminetetraacetic acid (EDTA) at a concentration of 24 to 30 gl$^{-1}$, sodium hydroxide (NaOH) at a concentration of 6-8 gl$^{-1}$, and formaldehyde at a concentration of 5-7.5 ml·l$^{-1}$.

Example 3

The method and device according to the invention were applied to activate the external surface 3 of a polyurethane catheter with a length of 100 mm, internal diameter of 1.4 mm, and external diameter 1.78 mm before being subsequently coated with a layer of chitosan with antimicrobial effects. The catheter, the hollow electrically nonconductive body 1, was first filled through its entire internal length with the electrically conductive liquid 4 formed by a solution of sodium chloride (NaCl) in distilled water at a concentration of 100 g per kilogram of solvent and conductivity of 130 mS·cm$^{-1}$. Afterwards it was inserted into the grounded electrode. The catheter, together with the grounded electrode, was placed into the reagent vessel 12 with a depth of 10 cm in such a manner as to ensure electrical insulation between the internal and external electrically conductive liquids 4, 5. Into the reagent vessel 12 there was slowly released the external electrically conductive liquid 5 formed by a solution of NaCl with the same composition as that of the internal conductive liquid 4. Into the external electrically conductive liquid 10 5 there was applied an alternating voltage 10 with amplitude (peak to peak) of 22 kV and a frequency of 20 kHz. In this way, on the external wall of the catheter 3, above the surface 8 of the external electrically conductive liquid 5, at an electrical power of 30 watts, there was generated a diffusion electrical plasma, forming a ring 11 around the external periphery of the catheter. The surface 8 of the external electrically conductive liquid 4 in the reagent vessel 12 continuously rose at a rate of 3 mm·sec$^{-1}$ against the surface of the catheter, while its external surface 3 was gradually activated by the influence of the plasma over its entire length, and free radicals were formed thereon. A 0.1 M solution of chitosan was prepared with a deacetylation degree of 75-85%. The catheter with the activated external surface 3 was immersed for one minute into the prepared solution, thereby causing the chitosan units to bond and adhere well to the surface of the catheter. The excess homopolymers of chitosan were removed from the surface of the catheter by cleaning in an ultrasonic bath filled with distilled water.

Example 4

The method and device according to the invention were applied to the immobilization of nanoparticles of titanium dioxide (TiO$_2$) with antimicrobial effects on the external surface 3 of a polyurethane catheter representing a hollow electrically nonconductive body 1 with a length of 100 mm, internal diameter of 1.4 mm and external diameter of 1.78 mm. Into the catheter, which was filled in its entire internal length with the electrically conductive liquid 4, a solution of sodium chloride (NaCl) in distilled water at a concentration of 100 g per kilogram of solvent and conductivity of 140 mS·cm$^{-1}$, there was inserted a grounded electrode. The catheter, together with the grounded electrode, was placed into the reagent vessel 12 with a depth of 10 cm in such a manner as to ensure the electrical insulation between the internal and external electrically conductive liquids 4, 5. The reagent vessel 12 was filled to a height of 2 cm from the external bottom of the electrically conductive liquid 5 with the same composition as the internal electrically conductive liquid 4, additionally containing 0.5% wt. suspension of TiO$_2$ nanoparticles. Into the internal electrically conductive liquid 4 there was led an alternating voltage 10 with amplitude (peak to peak) of 22 kV and frequency of 20 kHz. In this way, above the surface 8 at the external wall of the catheter at an electrical power of 30 W, there was generated a diffuse electrical plasma forming a ring 11 on the external circumference of the catheter. The surface 8 of the external electrically conductive liquid 5 in the reagent vessel 12 continuously rose at a rate of 3 mm·sec$^{-1}$ against the external surface 3 of the catheter, while its external surface 3 was gradually activated by the influence of the plasma, and simultaneously thereon a thin compact layer of $TiO_2$ nanoparticles was deposited with good adhesion to the external surface 3 of the catheter.

Example 5

Figure 2:
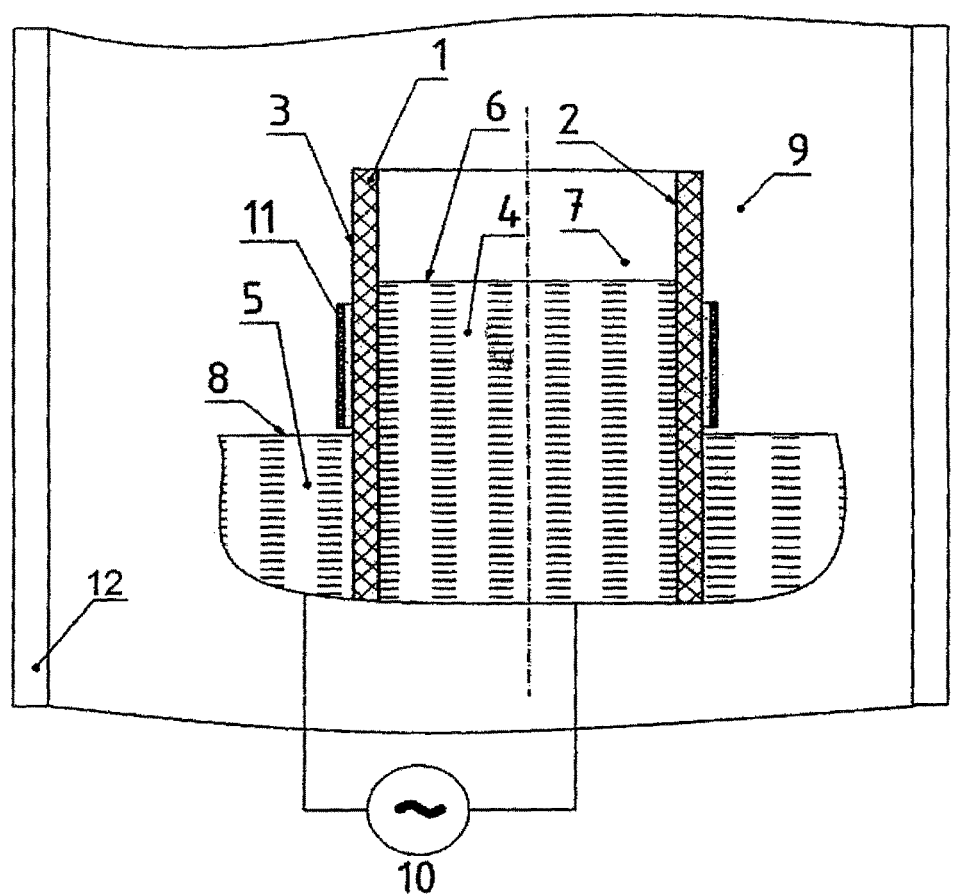
FIG. 2 shows a sectional view of the reagent vessel and the hollow electrically non-conductive body when the plasma treatment takes place on the external surface of the electrically non-conductive hollow body.
Figure 3:
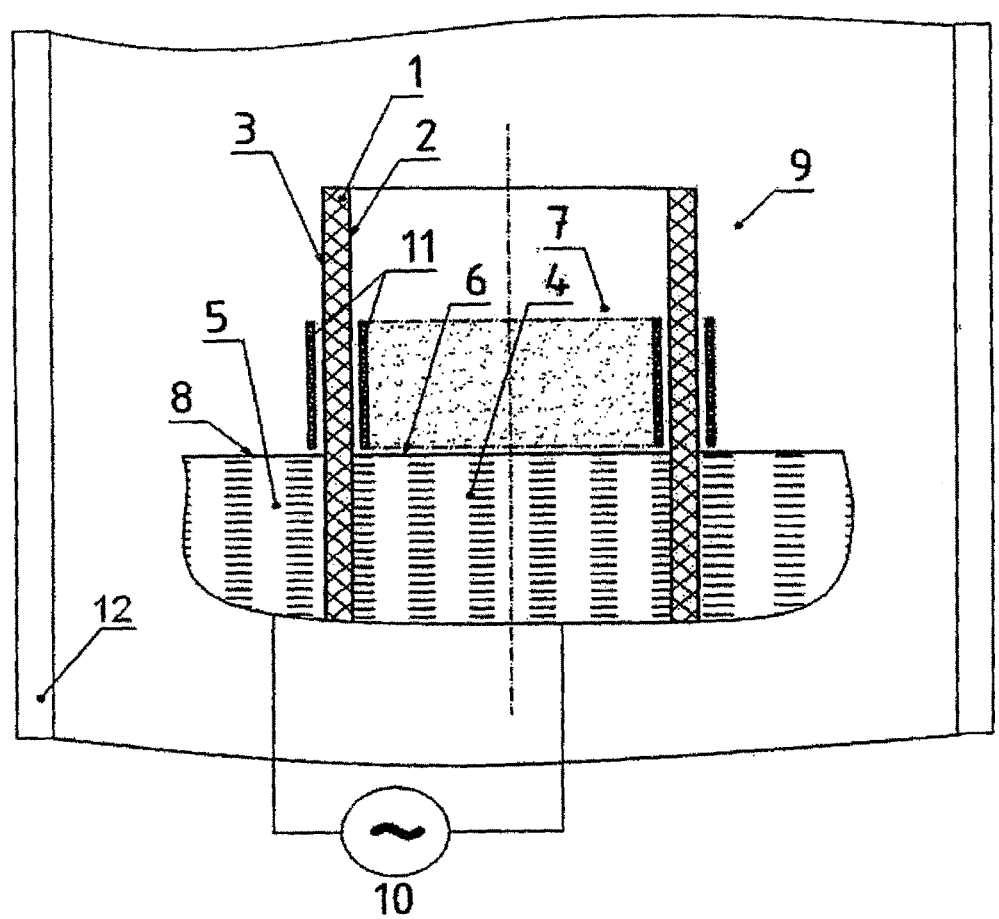
FIG. 3 shows a sectional view of the reagent vessel and the hollow electrically non-conductive body when the plasma treatment takes place on the internal and external surface of the electrically non-conductive hollow body.

The method and device according to the invention were applied to activate the external surface 3 of the hollow electrically non-conductive body 1 formed by a polytetrafluoroethylene (PTFE) tube having a length of 1 m, an external diameter of 8 mm, and a wall thickness of 0.5 mm for the subsequent coverage of a thus activated surface 3 with a layer of acrylic acid polymer. The external surface of the tube 3 was activated by the method illustrated in FIG. 2. The tube was completely filled internally with an electrically conductive liquid 4 represented by a solution of sodium chloride (NaCl) in distilled water at a concentration of 100 $g \cdot kg^{-1}$ and conductivity of 130 $mS \cdot cm^{-1}$. Into the internal part of the tube there was attached an electrode for high alternating voltage. The PTFE tube was then placed in the reagent vessel 12 with a height of 110 cm filled from the external bottom with the electrically conductive liquid 5 with the same chemical composition as the aforementioned internal electrically conductive liquid 4. The tube was placed in the reagent vessel 12 in such a way as to maintain the electrical insulation of the internal and external electrically conductive liquids 4, 5. Into the external electrically conductive solution there was placed an electrically grounded electrode and into the internal part of the tube was led an alternating voltage 10 with an amplitude (peak to peak) of 22 kV, a frequency of 20 kHz and a power of 50 W. In this way, above the surface 8 of the external electrically conductive liquid 5 on the external surface 3 of the hollow electrically non-conductive body 1 there was generated a diffuse electrical plasma forming a ring 11 around the external periphery of the body 1. By gradually filling the reagent vessel 12 with the external electrically conductive liquid 5, its surface 8 began to rise at a speed of 1.5 $mm \cdot s^{-1}$, thus obtaining a homogeneous plasma treatment and activation of the external surface 3 of the PTFE tube along its entire length. On the external surface 3 of the PTFE tube, by the effect of the plasma, free radicals were formed, and the external surface 3 became hydrophilic. A 20% wt. aqueous solution of acrylic acid (MERC Ltd.) was prepared. The solution was initially bubbled with nitrogen for 20 minutes. Into this prepared solution, the activated PTFE tube was immersed. The solution with the tube were subsequently left to react in a closed vessel at a temperature of 60° C. for 1 hour. After removal from the container, the PTFE tube was washed with distilled water and dried. In this manner, there formed on the external surface a 200 nm thick grafted and non-porous layer of polyacrylic acid with good adhesion to the surface of the tube. The surface of the PTFE tube modified according to this procedure has excellent wettability.

Example 6

The method and device according to the invention were applied to cover the external surface 3 of the PTFE tube, representing a hollow electrically non-conductive body 1 with a length of 1 m, an external radius of 8 mm, and a wall thickness of 0.5 mm of biocompatible hydrogel. The PTFE tube was completely internally filled with the electrically conductive liquid 4, represented by a solution of sodium chloride (NaCl) in distilled water at a concentration of 100 $g \cdot kg^{-1}$ and conductivity of 130 $mS \cdot cm^{-1}$. It was subsequently attached into a cylindrical reagent vessel 12 with a length of 110 cm and a diameter of 5 cm in such a way as to ensure electrical insulation between the internal and external electrically conductive liquids 4, 5. The bottom of the reagent vessel 12 was filled to an external height of 1 cm with electrically conductive liquid 5, which was 30% vol. aqueous solution of organic compounds containing 70% acrylamide, 29% acrylic acid and 1% N,N-methylene-bis-acrylamide. The external electrically conductive fluid 5 was electrically grounded, while into the internal electrically conductive liquid 4 there was led a negative pulse electrical voltage 10 with amplitude of 100 kV, the width of the leading edge of the pulse 20 ns, half-width of the pulse 2 µs, and a frequency of 100 Hz generated by a rotating spark gap. In this way, above the surface 8 of the external electrically conductive liquid 5 on the external surface 3 there was generated a diffuse electrical plasma forming a ring around the external circumference of the hollow body 1. By gradually filling the reaction vessel 12 with external electrically conductive liquid, its surface began to rise at a speed of 1 $mm \cdot s^{-1}$, thereby obtaining a homogeneous plasma treatment of the PTFE tube along its full length. On its external surface, by the effect of the plasma, this resulted in the coating of a copolymer hydrogel of the aforementioned monomers.

Example 7

The method and device according to the invention were applied to hydrophilize the internal surface 2 of a hollow electrically non-conductive body 1, a commercial plastic blood bag which was made from soft PVC. The bag was first completely filled internally with electrically conductive liquid 4, which was distilled water with added sodium chloride at a concentration of 100 $g \cdot kg^{-1}$ and conductivity of 130 $mS \cdot cm^{-1}$. Afterwards it was placed into the reagent vessel 12 with external electrically conductive liquid 5, which was normal drinking water with a conductivity of 0.3 $mS \cdot cm^{-1}$. Between the internal and external electrically conductive liquids 4, 5 was inserted alternating voltage 10 with an amplitude (peak to peak) of 15 kV and frequency of 50 kHz, while at the same time, into the bag there was led argon gas flowing in such a way that the internal electrically conductive liquid 4 was progressively pressed out of the bag. The intake of argon and the resulting drop of the surface 6 of the internal electrically conductive liquid 4 against the walls of the bag was set to a speed of approximately 5 $mm \cdot s^{-1}$. In the way, above the surface 6 of the internal electrically conductive liquid 4 in the mixture of argon and water vapor on the walls of the bag, there was generated a diffuse electrical plasma. By the effect of the plasma on, the internal surface 2 of the bag hydrophylized, which is advantageous in terms of its hematologic compatibility. A measurement of the zeta potential and the in vitro measurement of cell cultures showed that in comparison to the original surface, the internal surface 2 treated by the plasma was more negatively charged, thus significantly reducing the trapping of fibroblast cells. The device for the gradual adjustment of the height of the surface 6 of the internal electrically conductive liquid 4 and surface 8 of the external electrically conductive liquid 5 is formed by the introduction of argon.

INDUSTRIAL APPLICABILITY

The method of plasma treatment of the internal and/or external surface of a hollow electrically non-conductive body and the device for performing this method is especially useful in manufacturing processes and in technical practice where it is often necessary to modify the properties of the external and internal surfaces of products made from dielectric materials such as polymeric materials, glass, and ceramics in order to obtain the desired surface properties for their end use.

OVERVIEW OF THE LABELS USED IN THE DRAWINGS 1 electrically non-conductive hollow body
2 electrically non-conducting internal surface of hollow body
3 electrically non-conducting external surface of hollow body
4 internal electrically conductive liquid
5 external electrically conductive liquid
6 surface of internal electrically conductive liquid
7 internal volume of gas
8 surface of external electrically conductive liquid
9 external volume of gas
10 time varying voltage
11 ring of electrical plasma
12 reagent vessel

The invention claimed is:

1. A method of plasma treatment of the internal and/or external surface of a hollow electrically non-conductive body wherein on the internal surface of the hollow electrically non-conductive body and/or on the external surface of the hollow electrically non-conductive body there acts a layer of electrical plasma of surface dielectric barrier discharge generated in a volume of gas by alternating or pulse voltage with an amplitude higher than 100 V from a pair of liquid electrodes formed by an internal electrically conductive liquid situated inside the hollow electrically non-conductive body and external electrically conductive liquid situated outside the hollow electrically non-conductive body, wherein the electrical plasma is generated above and in contact with the surface, of the internal electrically conductive liquid and/or of the external electrically conductive liquid, where in the volume of gas there forms a layer of electrical plasma forming a ring copying the shape of the surface of the hollow electrically non-conductive body, wherein the electrical resistance between the liquid electrodes is greater than 10 kΩ.

2. The method according to claim 1, wherein first, the hollow electrically non-conductive body is inserted into a reagent vessel, in a further step the reagent vessel around the hollow body is filled with the external electrically conductive liquid, which is electrically grounded, and subsequently the internal volume of the hollow electrically non-conductive body is gradually internally filled with the electrically conductive liquid into which is led an alternating voltage, by which above the surface of the internal electrically conductive liquid there is generated a ring of electrical plasma, and the surface of the internal electrically conductive liquid gradually rises, thus treating the internal surface of the hollow electrically non-conductive body along its entire length.

3. The method according to claim 1, wherein first, the internal volume of the electrically non-conductive hollow body is filled internally with an electrically conductive liquid which is electrically grounded, then the reagent vessel around the hollow electrically non-conductive body is gradually filled with the external electrically conductive liquid, into which is led an alternating voltage by which above the surface of the external electrically conductive liquid there is generated a ring of electrical plasma and the surface of the external electrically conductive liquid gradually rises.

4. The method according to claim 1, wherein the hollow electrically non-conductive body is inserted into the reagent vessel and subsequently the reagent vessel is gradually filled with an external electrically conductive liquid while at the same time, the hollow electrically non-conductive body is gradually filled internally with the electrically conductive liquid, wherein into one liquid electrode there is led alternating voltage and the second liquid electrode is grounded, and a ring of electrical plasma is generated both above the internal electrically conductive liquid and the external electrically conductive liquid at the same time.

5. The method according to claim 1, wherein the plasma is generated under a gas pressure greater than 10 kPa and less than 200 kPa.

6. The method according to claim 1 wherein the frequency in the time varying voltage supplied between the internal electrically conductive liquid and the external electrically conductive liquid is between 50 Hz and 20 MHz.

7. The method according to claim 1, wherein the amplitude of the voltage supplied between the internal electrically conductive liquid and the external electrically conductive liquid is in the range of 100 V to 200 kV.

8. The method according to claim 1, wherein the internal electrically conductive liquid and/or external electrically conductive liquid contains at least 50% vol. water.

9. The method, according to claim 1, wherein the internal electrically conductive liquid and/or external electrically conductive liquid contains at least 1% vol. hydrocarbon compounds.

10. The method according to claim 1 wherein the internal electrically conductive liquid and/or external electrically conductive liquid contains dispersed inorganic nanoparticles.

* * * * *